(12) United States Patent
Lee (10) Patent No.: US 7,768,858 B2
(45) Date of Patent: Aug. 3, 2010

(54) REFRESH CONTROLLING CIRCUIT (75) Inventor: Sang Kwon Lee, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 238 days.

(21) Appl. No.: 12/005,478

(22) Filed: Dec. 27, 2007

(65) Prior Publication Data
US 2009/0109783 A1 Apr. 30, 2009

(30) Foreign Application Priority Data
Oct. 31, 2007 (KR) .................. 10-2007-0110505

(51) Int. Cl.
G11C 7/00 (2006.01)
(52) U.S. Cl. .................. 365/222; 365/227; 365/228
(58) Field of Classification Search .................. 365/222, 365/227, 228
See application file for complete search history.

(56) References Cited
U.S. PATENT DOCUMENTS
6,307,779 B1 * 10/2001 Roohparvar ........... 365/185.11
6,333,886 B2 12/2001 Cho et al.
6,549,991 B1 * 4/2003 Huang et al. .............. 711/158
6,906,977 B2 6/2005 Park
7,440,352 B2 * 10/2008 Nam ....................... 365/222

FOREIGN PATENT DOCUMENTS
KR 10-1999-0078379 A 10/1999
KR 10-2004-0008015 A 1/2004
KR 10-2007-0105500 A 10/2007

* cited by examiner

Primary Examiner—Connie C Yoha
(74) Attorney, Agent, or Firm—John P. White; Cooper & Dunham LLP (57) ABSTRACT A refresh controlling circuit includes an MRS latch unit configured to output a mask information signal of a bank and a mask information signal of a segment by synchronizing a first address signal and a second address signal with a pulse signal, a bank active control unit configured to output a bank active signal in response to the mask information signal of the bank, and a decoding unit configured to output a row address decoding signal in response to the bank active signal, the mask information signal of the segment, and a third address signal.

17 Claims, 8 Drawing Sheets

FIG. 1
(PRIOR ART)

| PASR Map | Bank 0 | Bank 1 | Bank 2 | Bank 3 |
|---|---|---|---|---|
| Full Array | | | | |
| 1/2 Array | | | No Self Refresh | |
| 1/4 Array | | No Self Refresh | | |

| PASR_SEG | | Bank 0 | Bank 1 | Bank 2 | Bank 3 |
|---|---|---|---|---|---|
| Segment0 | 0 | | Masked | | |
| Segment1 | 0 | | | | |
| Segment2 | 1 | Masked | | Masked | |
| Segment3 | 0 | | | | |
| Segment4 | 0 | | | | |
| Segment5 | 0 | | | | |
| Segment6 | 0 | | | | |
| Segment7 | 1 | | | Masked | |
| PASR_BANK | | 0 | 1 | 0 | 0 |

REFRESH CONTROLLING CIRCUIT

BACKGROUND

The present disclosure relates to a semiconductor device, and more particularly, to a refresh controlling circuit.

In LPSDR or LPDDR, selection of a partial array self refresh (PASR) Map can be determined within a preset bank region. Accordingly, such a selection is possible by controlling only a bank active signal.

Figure 1:
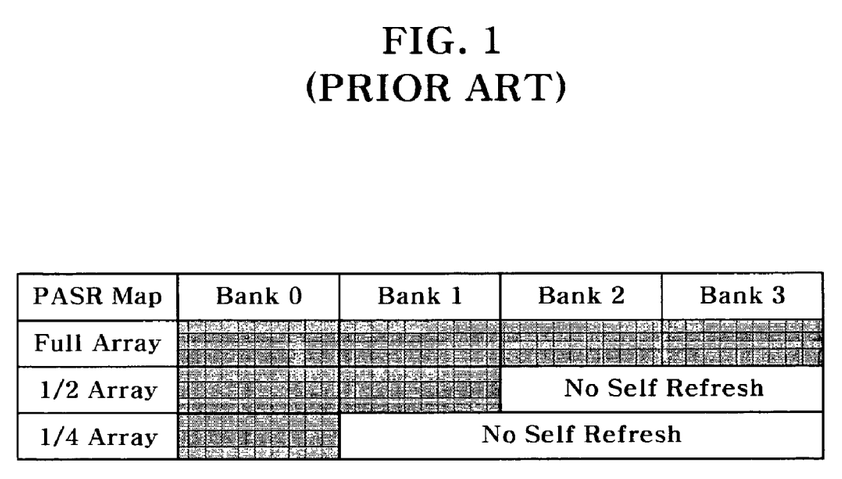
FIG. 1 exemplarily illustrates a conventional 4-bank PASR Map.

FIG. 1 exemplarily illustrates a conventional 4-bank PASR Map.

Referring to FIG. 1, a self refresh region is determined according to a mode register set (MRS). In the conventional art, the bank cannot be arbitrarily set and it is possible to select only a Full-Array, ½ Array, or ¼ Array. In other words, it is impossible to set only the Bank 1 as a self refresh region.

Figure 2:
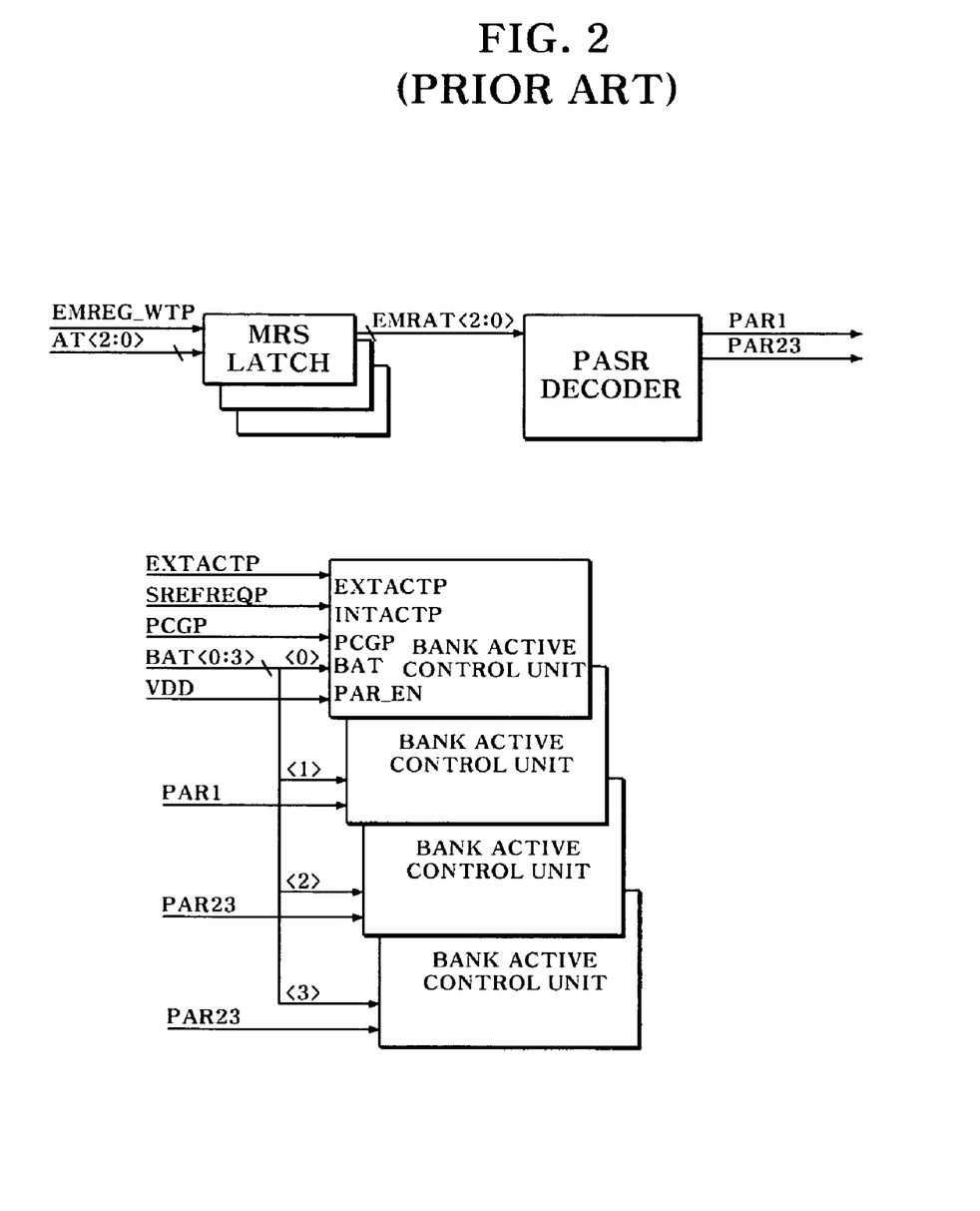
FIG. 2 illustrates a block diagram of a conventional self refresh controlling circuit.
Figure 3:
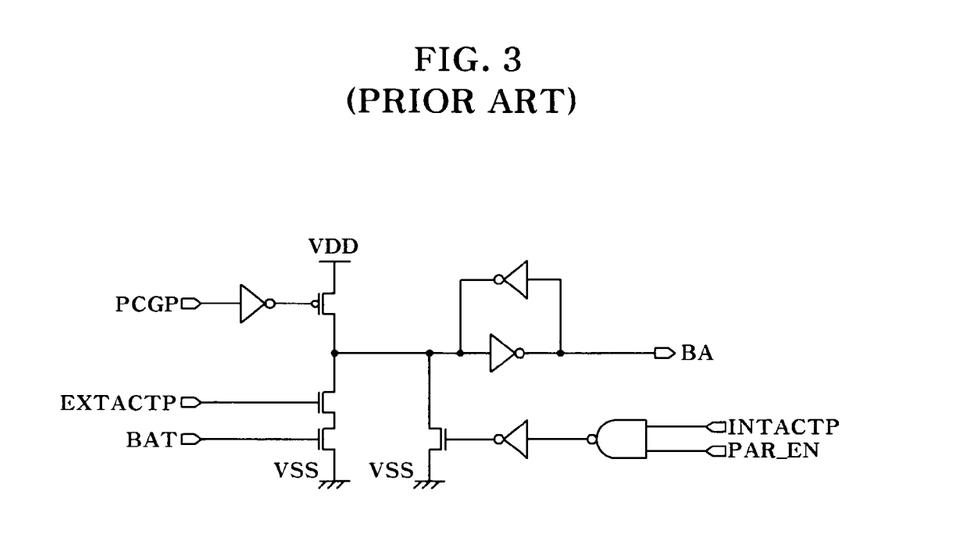
FIG. 3 illustrates a circuit diagram of a bank active control unit in the self refresh controlling circuit of FIG. 2.
Figure 4:
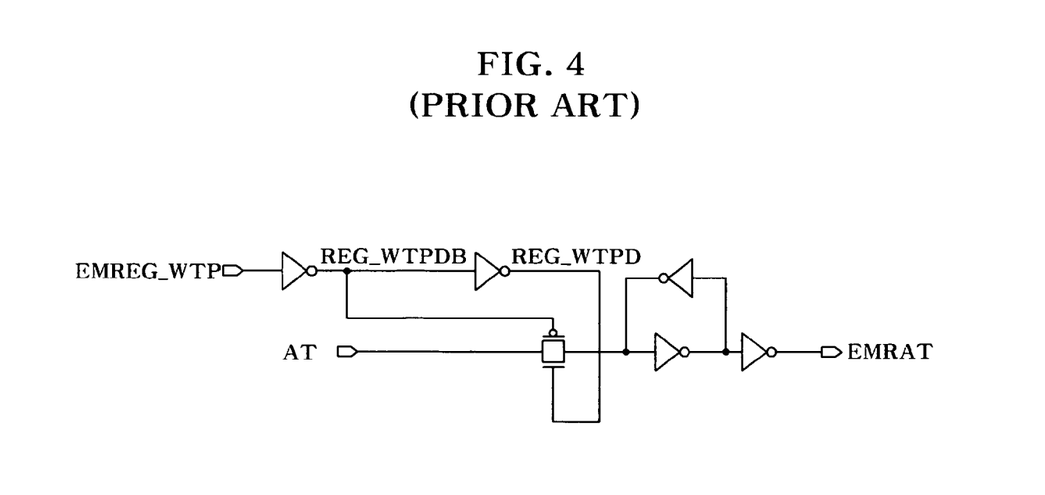
FIG. 4 illustrates a circuit diagram of a MRS latch unit in the self refresh controlling circuit of FIG. 2.
Figure 5:
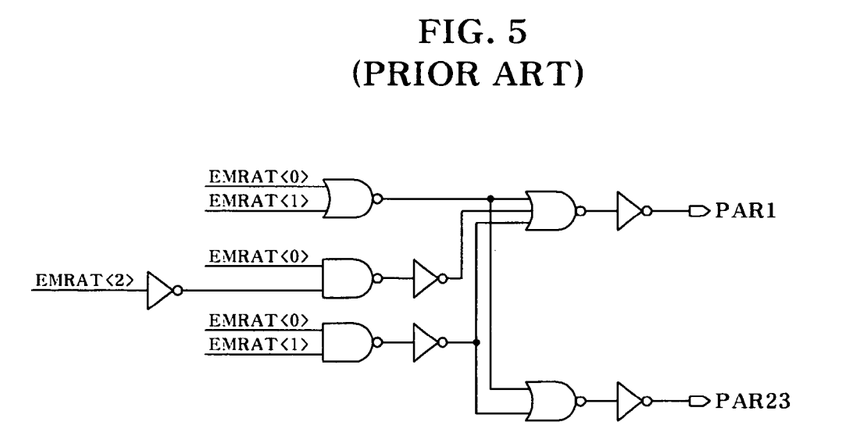
FIG. 5 illustrates a circuit diagram of a PASR decoder in the self refresh controlling circuit of FIG. 2.

FIG. 2 illustrates a block diagram of a conventional self refresh controlling circuit including a bank active control unit, a MRS latch and a PASR decoder. FIG. 3 illustrates a circuit diagram of the bank active control unit of FIG. 2, FIG. 4 illustrates a circuit diagram of the MRS latch unit of FIG. 2, and FIG. 5 illustrates a circuit diagram of the PASR decoder of FIG. 2.

When the MRS is set as shown in the table of FIG. 1, values of PAR1 and PAR23 are determined. When Full-Array or ½ Array is selected, the PAR1 is activated to a logic high level. Only when Full-Array is selected, the PAR23 is activated to a logic high level. Bank active control units are provided in a same number as the number of banks.

An output signal BA<0:3> of the bank active control unit is activated to a logic high level when an input signal PAR_EN is at a logic high level and a self refresh active pulse signal SREFREQP is toggled to a logic high level.

Since Bank 0 can be always self-refreshed according to the table of FIG. 1, the PAR_EN of the bank active control unit of Bank 0 is always fixed to a logic high level. The PAR_EN of the bank active control unit of Bank 1 is connected with PAR1, and the PAR_ENs of the bank active control units of Banks 2 and 3 are connected with PAR23.

If ¼ Array is selected through the MRS, PAR1 and PAR23 are all at a logic low level. Accordingly, if the self refresh active pulse signal SREFREQP is toggled, only the BA<0> is activated to a logic high level.

If ½ Array is selected, only PAR1 becomes a logic high level and accordingly BA<0> and BA<1> are activated to a logic high level. That is, only the bank 0 and bank 1 are enabled.

If Full Array is selected, PAR1 and PAR23 are all at a logic high level. Accordingly, each of BA<0:3> becomes a logic high level, so that all banks are enabled.

Thus, the conventional self refresh controlling circuit cannot be set to refresh only a specific region of each bank or each segment within each bank.

BRIEF SUMMARY

Various embodiments of the present invention are described herein directed to a refresh controlling circuit that can refresh only a specific region of each bank of a semiconductor memory.

In an aspect of the disclosure, a refresh controlling circuit includes a MRS (mode register set) latch unit configured to output a mask information signal of a bank and a mask information signal of a segment by synchronizing a first address signal and a second address signal with a pulse signal, a bank active control unit configured to output a bank active signal in response to the mask information signal of the bank, and a decoding unit configured to output a row address decoding signal in response to the bank active signal, the mask information signal of the segment, and a third address signal.

Thus, it is possible to refresh each bank and each segment using the masked information signal of the bank and the masked information signal of the segment through MRS. Also, when the PASR (Partial Array Self Refresh) is achieved, the refresh controlling circuit can be used without a refresh counter or without an alteration in period, so that the circuit area can be reduced, the self refresh current can be decreased, and an efficient and easy control of a memory in a chipset is made possible.

DESCRIPTION OF EXEMPLARY EMBODIMENTS

Hereinafter, a refresh controlling circuit in accordance with examples and exemplary embodiments of the present invention will be described in detail with reference to the accompanying drawings.

Figure 6:
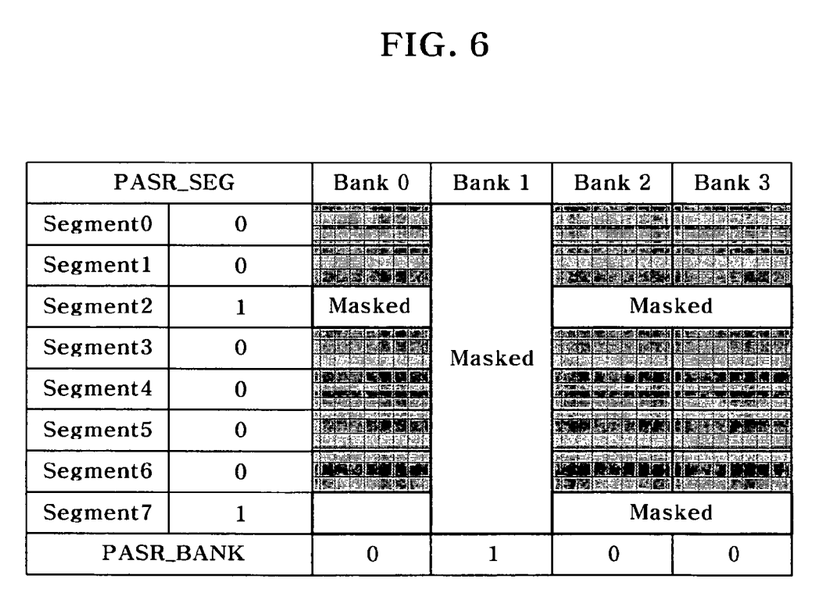
FIG. 6 exemplarily illustrates 4-bank PASR Map according to an exemplary embodiment of the present disclosure.

FIG. 6 exemplarily illustrates a 4-bank PASR Map according to an exemplary embodiment of the present disclosure. Referring to FIG. 6, each bank is divided into eight segments. FIG. 6 shows that Bank 1, Segment 2 and Segment 7 are masked through an MRS. In other words, it is possible to flexibly set a self-refresh region. Segments are prioritized over banks in the masked regions.

Figure 7:
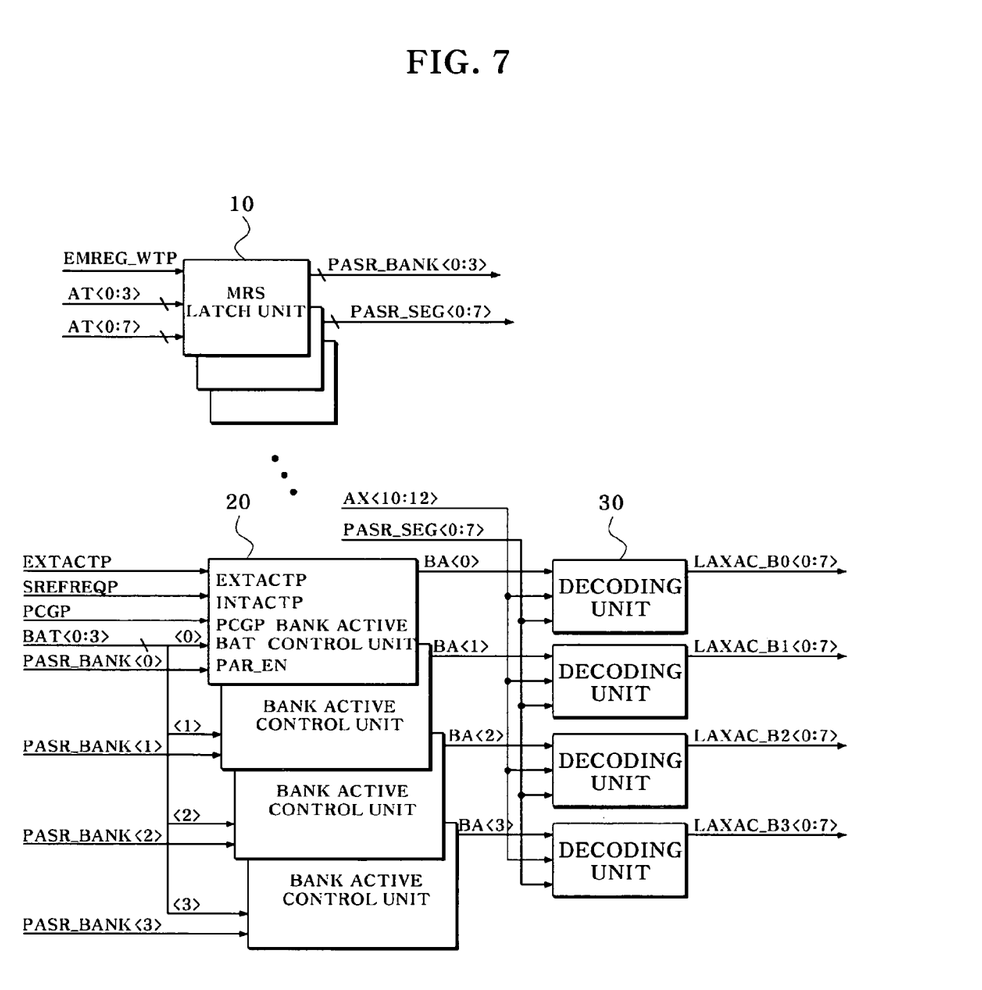
FIG. 7 is a block diagram of a self-refresh controlling circuit according to an exemplary embodiment of the present disclosure.

FIG. 7 illustrates a block diagram of a self-refresh controlling circuit according to an exemplary embodiment of the present disclosure.

Referring to FIG. 7, the self-refresh controlling circuit includes an MRS latch unit 10, a bank active control unit 20, and a decoding unit 30. The MRS latch unit 10 outputs a mask information signal PASR_BANK<0:3> of a bank and a mask information signal PASR_SEG<0:7> of a segment by synchronizing a first address signal AT<0:3> and a second address signal AT<0:7> with a pulse signal. The bank active control unit 20 outputs a bank active signal in response to the mask information signal PASR_BANK<0:3> of the bank. The decoding unit 30 decodes a third address signal AX<10:12> in response to the bank active signal and the mask information signal PASR_SEG<0:7> of the segment.

Herein, the first address signal ATR<0:3> is a bank address signal, the second address signal ATF<0:7> is a segment address signal, and the third address signal AX<10:12> is a row address signal.

Figure 8:
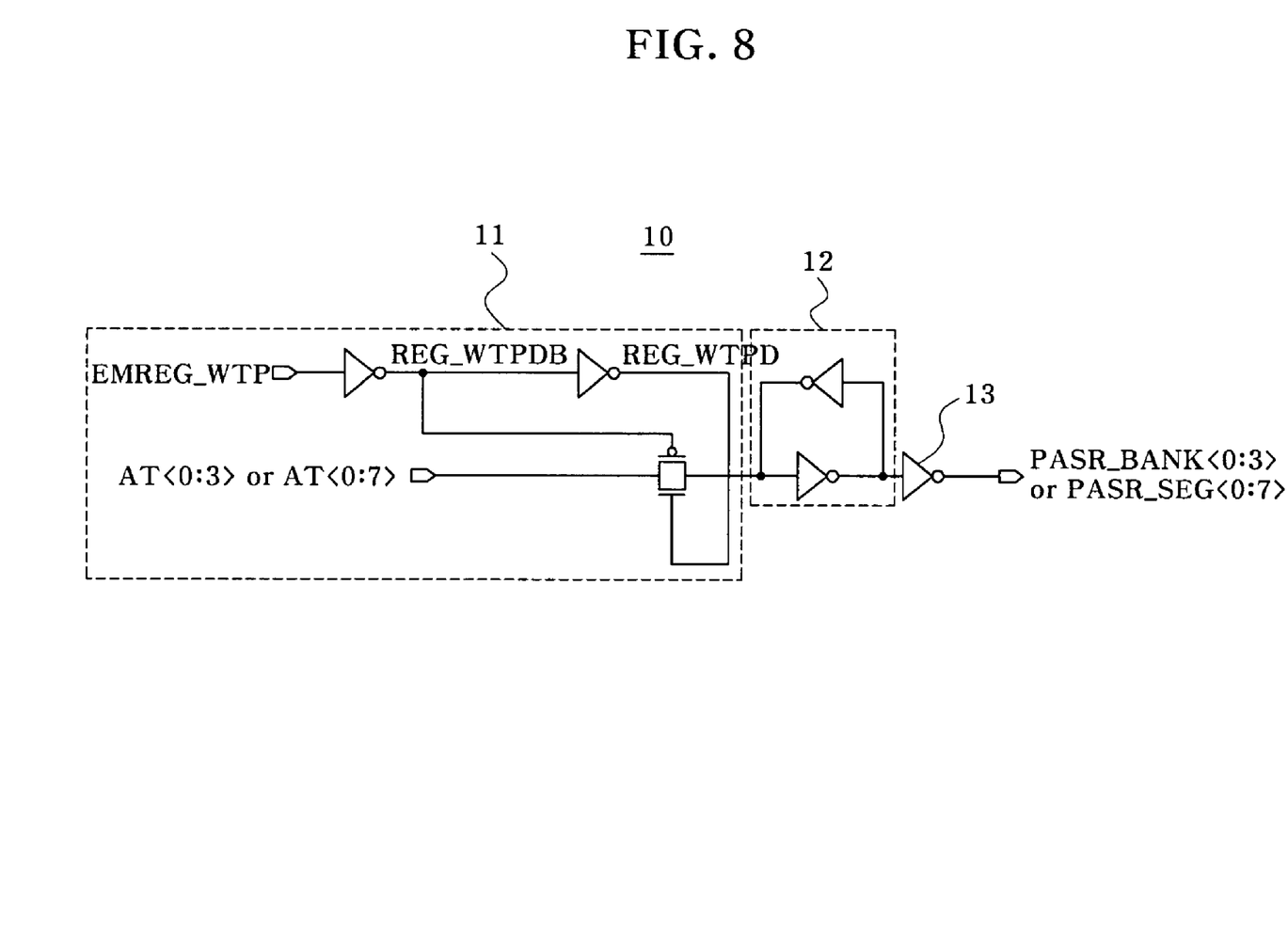
FIG. 8 illustrates a circuit diagram of a MRS latch unit in the self refresh controlling circuit of FIG. 7.

FIG. 8 illustrates a circuit diagram of a MRS latch unit in the self refresh controlling circuit of FIG. 7. Referring to FIG. 8, the MRS latch unit 10 includes a signal transferring unit 11, a latch unit 12, and a buffer unit 13. The signal transferring unit 11 outputs the first and second signals in synchronization with the pulse signal. The latch unit 12 latches an output signal of the signal transferring unit 11. The buffer unit 13 buffers an output signal of the latch unit 12.

Figure 9:
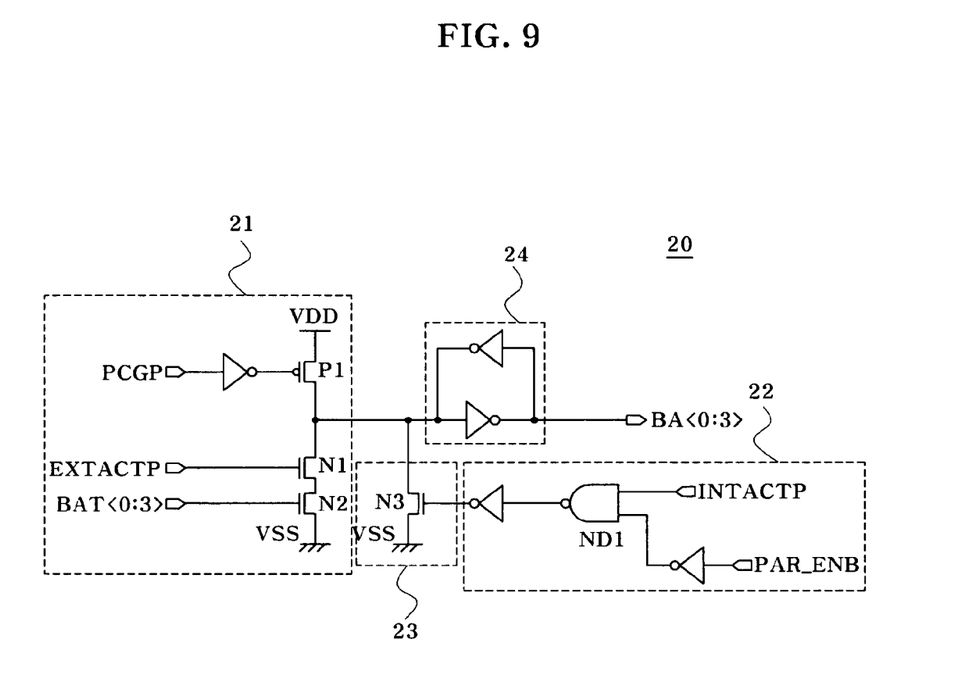
FIG. 9 illustrates a circuit diagram of a bank active control unit in the self refresh controlling circuit of FIG. 7.

FIG. 9 illustrates a circuit diagram of a bank active control unit in the self-refresh controlling circuit of FIG. 7. Referring to FIG. 9, the bank active control unit 20 includes a first driving unit 21, an operating unit 22, a second driving unit 23, and a latch unit 24. The first driving unit 21 performs pull-up-driving or pull-down-driving of a first node in response to a precharge pulse signal (PCGP), an external active signal (EXTACTP) and a bank active signal (BAT). The operating unit 22 performs a logical operation in response to the mask information signal (PAR_ENB) of the bank and an internal active signal (INTACTP). The second driving unit 23 performs pull-down driving of the first node in response to an output signal of the operating unit 22. The latch unit 24 latches output signals of the first and second driving units 21 and 23.

The first driving unit 21 includes a pull-up driving unit (P1), a first pull-down driving unit (N1), and a second pull-down driving unit (N2). The pull-up driving unit (P1) performs pull-up driving in response to the precharge pulse signal. The first pull-down driving unit (N1) performs pull-down driving in response to the external active signal. The second pull-down driving unit (N2) performs pull-down driving in response to the bank active signal.

The operating unit 22 includes a logic device ND1 performing an AND operation in response to an inverted signal of the mask information signal of the bank and the internal active signal.

The second driving unit 23 includes a pull-down driving unit N3 performing pull-down driving in response to the output signal of the operating unit 22.

Figure 10:
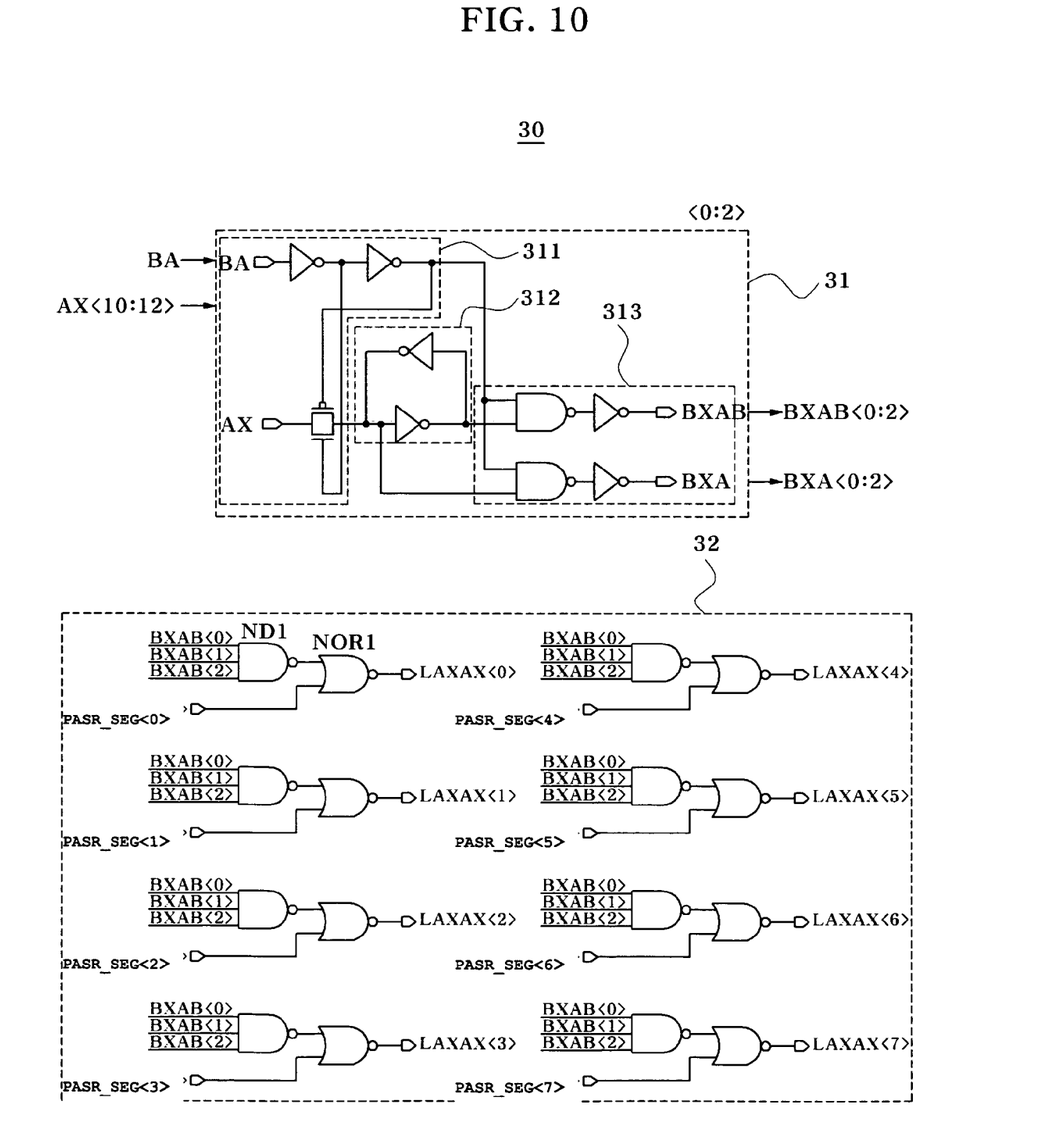
FIG. 10 illustrates a circuit diagram of a decoding unit in the self refresh controlling circuit of FIG. 7.

FIG. 10 illustrates a circuit diagram of a decoding unit in the self-refresh controlling circuit of FIG. 7. Referring to FIG. 10, the decoding unit 30 includes a predecoder 31, and a decoder 32. The predecoder 31 predecodes a third address signal AX<10:12> in response to the bank active signal BA. The decoder 32 decodes output signals BXA<0:2> and BXAB<0:2> of the predecoder 31 in response to the mask information signal PASR_SEG<0:7> of the segment.

The predecoder 31 includes a signal transferring unit 311, a latch unit 312, and a buffer unit 313. The signal transferring unit 311 outputs the third address signal in synchronization with the bank active signal. The latch unit 312 latches an output signal of the signal transferring unit 311. The buffer unit 313 buffers an output signal of the latch unit 312 in synchronization with the bank active signal.

The decoder 32 includes a first operating unit ND1 and a second operating unit NOR1. The first operating unit ND1 performs a NAND operation on output signals of the predecoder 31. The second operating unit NOR1 performs a NOR operation on the mask information signal PASR_SEG of the segment and an output signal of the first operating unit ND1.

Thus, the refresh controlling circuit according to the exemplary embodiment of FIG. 7 includes the MRS latch unit 10 storing PASR information through MRS, the bank active control unit 20, and the row address decoding unit 30 provided in each bank. The decoding unit 30 is exemplified by the predecoder controlled by the segment and having a total of 13 row addresses, i.e., AX<0:12>.

The MRS latch unit 10 outputs the bank address signals AT<0:3>, as mask information PASR_BANK<0:3> of four banks, in synchronization with the pulse signal EMREG_WTP generated by a MRS command, and also outputs the segment address signals AT<0:7>, as mask information PASR_SEG<0:7> of eight segments, in synchronization with the pulse signal. Among PASR_BANK<0:3>, the bank 'high" is a region which is not refreshed during a self refresh. Likewise, among PASR_SEG<0:7>, the segment 'high' is a region which is masked.

In the bank active control unit 20, PAR_EN is replaced by PAR_ENB and an inverter so as to match the polarity with PASR_BANK. Each bank active control unit can make active for refresh only the bank 'low', which is 1:1 matched with PASR_BANK<0:3>. That is, the bank active signal which is an output of the bank active control unit 20 when PASR_BANK is a logic high level is always at a logic low level even if a self refresh request signal is inputted.

Assuming that there are 13 row addresses, i.e., AX<0:12> as shown in FIG. 10, the decoding unit 30 must control the highest three bits so as to divide each bank into eight segments. Accordingly, it is possible to divide each bank into eight parts according to the value of PASR_SEG by assigning AX<10:12> to the eight predecoded output addresses PASR_SEG<0:7>.

First, AX<0:12> is sequentially increased by an internal refresh counter. The address is latched by the bank active signal to store a corresponding address value every bank. Among those, AX<10:12> is latched to BXA<0:2> and BXAB<0:3>, respectively, and is predecoded into LAXAC<0:7>. The value of LAXAC becomes 'low' according to PASR_SEG having the value of 'high' among PASR_SEG<0:7> inputted into NOR outputting LAXAC. That is, the masked segment that PASR_SEG is high becomes 'low' regardless of an input address, so that a corresponding segment is not refreshed.

Thus, in the refresh controlling circuit according to the present invention, it is possible to refresh each bank and each segment using the masked information signal of the bank and the masked information signal of the segment through MRS. Also, when the PASR (Partial Array Self Refresh) is achieved, the refresh controlling circuit can be used without a refresh counter or without an alteration in period, so that the circuit area can be reduced, the self refresh current can be decreased, and an efficient and easy control of a memory in a chipset is made possible.

While the present invention has been described with respect to examples and exemplary embodiments, it will be apparent to those skilled in the art that various changes and modifications may be made without departing from the spirit and scope of the disclosure and the following claims.

The present disclosure claims priority to Korean patent application number 10-2007-0110505, filed on Oct. 31, 2007, the entire contents of which are incorporated herein by reference.

What is claimed is:

1. A refresh controlling circuit, comprising:
a mode register set (MRS) latch unit configured to transfer a first address signal to a first mask information signal of a bank in response to a pulse signal, and transfer a second address signal to a second mask information signal of a segment in response to the pulse signal;

a bank active control unit configured to output a bank active signal in response to the first mask information signal of the bank; and a decoding unit configured to output a row address decoding signal in response to the bank active signal, the second mask information signal of the segment, and a third address signal.

2. The refresh controlling circuit of claim 1, wherein the first address signal is a bank address signal, the second address signal is a segment address signal, and the third address signal is a row address signal.

3. The refresh controlling circuit of claim 1, wherein the MRS latch unit comprises:

a signal transferring unit configured to output the first and second address signals in synchronization with the pulse signal;

a latch unit configured to latch an output signal of the signal transferring unit; and a buffer unit configured to buffer an output signal of the latch unit.

4. The refresh controlling circuit of claim 1, wherein the bank active control unit comprises:

a first driving unit configured to perform pull-up-driving or pull-down-driving of a first node in response to a precharge pulse signal, an external active signal and the bank active signal;

an operating unit configured to perform a logical operation in response to the first mask information signal of the bank and an internal active signal;

a second driving unit configured to perform pull-down driving of the first node in response to an output signal of the operating unit; and a latch unit configured to latch output signals of the first and second driving units.

5. The refresh controlling circuit of claim 4, wherein the first driving unit comprises:

a pull-up driving unit configured to perform pull-up driving in response to the precharge pulse signal;

a first pull-down driving unit configured to perform pull-down driving in response to the external active signal; and a second pull-down driving unit configured to perform pull-down driving in response to the bank active signal.

6. The refresh controlling circuit of claim 4, wherein the operating unit comprises a logic device configured to perform an AND operation in response to an inverted signal of the first mask information signal of the bank and the internal active signal.

7. The refresh controlling circuit of claim 4, wherein the second driving unit comprises a pull-down driving unit configured to perform pull-down driving in response to the output signal of the operating unit.

8. The refresh controlling circuit of claim 1, wherein the decoding unit comprises:

a predecoder configured to predecode the third address signal in response to the bank active signal; and a decoder configured to decode an output signal of the predecoder in response to the second mask information signal of the segment.

9. The refresh controlling circuit of claim 8, wherein the predecoder comprises:

a signal transferring unit configured to output the third address signal in synchronization with the bank active signal; a latch unit configured to latch an output signal of the signal transferring unit; and a buffer unit configured to buffer an output signal of the latch unit in synchronization with the bank active signal.

10. The refresh controlling circuit of claim 8, wherein the decoder comprises:

a first operating unit configured to perform a NAND operation on output signals of the predecoder; and a second operating unit configured to perform a NOR operation on the second mask information signal of the segment and an output signal of the first operating unit.

11. A refresh controlling circuit, comprising:

a first driving unit configured to perform pull-up driving or pull-down driving of a first node in response to a precharge pulse signal, an external active signal and a bank active signal;

an operating unit configured to perform a logical operation in response to a first mask information signal of a bank and an internal active signal;

a second driving unit configured to perform pull-down driving of the first node in response to an output signal of the operating unit;

a latch unit configured to latch output signals of the first and second driving units; and a decoding unit configured to output a row address decoding signal in response to the bank active signal and a second mask information signal of a segment.

12. The refresh controlling circuit of claim 11, wherein the first driving unit comprises:

a pull-up driving unit configured to perform pull-up driving in response to the precharge pulse signal;

a first pull-down driving unit configured to perform pull-down driving in response to the external active signal; and a second pull-down driving unit configured to perform pull-down driving in response to the bank active signal.

13. The refresh controlling circuit of claim 11, wherein the operating unit comprises a logic device configured to perform an AND operation in response to an inverted signal of the first mask information signal of the bank and the internal active signal.

14. The refresh controlling circuit of claim 11, wherein the second driving unit comprises a pull-down driving unit configured to perform pull-down driving in response to the output signal of the operating unit.

15. The refresh controlling circuit of claim 11, wherein the decoding unit comprises:

a predecoder configured to predecode a row address signal in response to the bank active signal; and a decoder configured to decode an output signal of the predecoder in response to the second mask information signal of the segment.

16. The refresh controlling circuit of claim 15, wherein the predecoder comprises:

a signal transferring unit configured to output the row address signal in synchronization with the bank active signal;

a latch unit configured to latch an output signal of the signal transferring unit; and a buffer unit configured to buffer an output signal of the latch unit in synchronization with the bank active signal.

17. The refresh controlling circuit of claim 15, wherein the decoder comprises:

a first operating unit configured to perform a NAND operation on output signals of the predecoder; and a second operating unit configured to perform a NAND operation on the second mask information signal of the segment and an output signal of the first operating unit.

* * * * *